US012598715B2

(12) United States Patent
Chen et al.

(10) Patent No.: US 12,598,715 B2
(45) Date of Patent: Apr. 7, 2026

(54) DRIVING MECHANISM

(71) Applicants: KING SLIDE WORKS CO., LTD., Kaohsiung City (TW); KING SLIDE TECHNOLOGY CO., LTD., Kaohsiung City (TW)

(72) Inventors: Ken-Ching Chen, Kaohsiung City (TW); Shun-Ho Yang, Kaohsiung City (TW); Chi-Chih Chou, Kaohsiung City (TW); Chih-Hsin Yeh, Kaohsiung City (TW); Chun-Chiang Wang, Kaohsiung City (TW)

(73) Assignees: KING SLIDE WORKS CO., LTD., Kaohsiung City (TW); KING SLIDE TECHNOLOGY CO., LTD., Kaohsiung City (TW)

( * ) Notice: Subject to any disclaimer, the term of this patent is extended or adjusted under 35 U.S.C. 154(b) by 227 days.

(21) Appl. No.: 18/596,668

(22) Filed: Mar. 6, 2024

(65) Prior Publication Data

US 2025/0072605 A1 Mar. 6, 2025

(30) Foreign Application Priority Data

Sep. 6, 2023 (TW) ................................. 112134170

(51) Int. Cl.
*H05K 5/02* (2006.01)
*H05K 7/14* (2006.01)
(52) U.S. Cl.
CPC ........... *H05K 5/023* (2013.01); *H05K 7/1401* (2013.01)

(58) Field of Classification Search
CPC ...... H05K 7/14; H05K 7/1401; H05K 7/1411; H05K 7/1412; H05K 7/1489; H05K 5/023
See application file for complete search history.

(56) References Cited

U.S. PATENT DOCUMENTS

| | | | | | |
|---|---|---|---|---|---|
| 9,122,458 | B2 * | 9/2015 | Yu | ............................ | G06F 1/185 |
| 9,826,658 | B1 * | 11/2017 | Mao | ......................... | G06F 1/183 |
| 10,168,747 | B2 * | 1/2019 | Zhu | ........................ | H05K 7/1489 |
| 10,251,300 | B1 * | 4/2019 | Mao | ...................... | H05K 7/1487 |
| 10,383,249 | B1 * | 8/2019 | Peng | .................... | H05K 7/1489 |

(Continued)

FOREIGN PATENT DOCUMENTS

| | | |
|---|---|---|
| CN | 106249817 A | 12/2016 |
| CN | 109587994 A | 4/2019 |

(Continued)

*Primary Examiner* — Daniel J Rohrhoff
(74) *Attorney, Agent, or Firm* — Winston Hsu

(57) ABSTRACT

A driving mechanism is provided and includes a first casing, a second casing and an operating member. The second casing is arranged on the first casing. The operating member is movably mounted on one of the first casing and the second casing. When the operating member is moved from a first state to a second state, the operating member drives another one of the first casing and the second casing to move from a first predetermined position to a second predetermined position along a first vertical direction. When the operating member is moved from the second state to the first state, the another one of the first casing and the second casing moves from the second predetermined position to the first predetermined position along a second vertical direction opposite to the first vertical direction.

20 Claims, 14 Drawing Sheets

(56) References Cited

U.S. PATENT DOCUMENTS

| | | | | |
|---|---|---|---|---|
| 2009/0273901 A1* | 11/2009 | Jaramillo | ............. | H05K 7/1492 |
| | | | | 361/679.58 |
| 2015/0103492 A1* | 4/2015 | Wu | ...................... | H05K 7/1431 |
| | | | | 361/726 |
| 2017/0347472 A1* | 11/2017 | Yu | ......................... | G11B 33/128 |
| 2022/0386497 A1* | 12/2022 | Wang | ................... | H05K 7/1489 |
| 2023/0049413 A1 | 2/2023 | Tan | | |
| 2023/0337387 A1* | 10/2023 | Wang | ................... | H05K 5/0221 |
| 2024/0032233 A1* | 1/2024 | Alvarado | ........... | H05K 7/20136 |
| 2025/0338424 A1* | 10/2025 | Chien | ................. | H05K 7/1489 |

FOREIGN PATENT DOCUMENTS

| | | | |
|---|---|---|---|
| CN | 113687695 A | 11/2021 | |
| TW | I783647 B | 11/2022 | |

* cited by examiner

DRIVING MECHANISM

BACKGROUND OF THE INVENTION

1. Field of the Invention

The present invention relates to a driving mechanism, and more specifically, to a driving mechanism for driving a relative movement of two casings by utilizing an operating member.

2. Description of the Prior Art

In U.S. Patent Publication No. 2023/0049413 A1, it discloses a tray module adapted for a chassis. The chassis includes at least two side plates. Each side plate has a track member. The track member includes a first horizontal section, an inclined section and a second horizontal section. The inclined section is connected to and located between the first horizontal section and the second horizontal section. The first horizontal section, the inclined section and the second horizontal section cooperatively form an S-shaped structure substantially. The tray module includes a carrier body, at least two first connecting rods, and at least two second connecting rods. Each first connecting rod has a movable end and a driven end. The movable end of each first connecting rod is pivotally connected to the carrier body and slidably disposed in the corresponding track member. Each second connecting rod has a pivotal end, an operating end and a pivotal connection portion located between the pivotal end and the operating end. The pivotal end of each second connecting rod is pivotally connected to the corresponding side plate. The driven end of each first connecting rod is pivotally connected to the pivotal connection portion of the corresponding second connecting rod. When a user operates a handle to pull the second connecting rods upwardly, the first connecting rods are driven to move along a S-shaped path formed by the first horizontal section, the inclined section and the second horizontal section of the track member, such that the tray module switches from a received state to a lifted state along a non-straight path or a non-vertical path.

However, in order to meet various requirements, it becomes an important topic to provide an alternative solution for easy mounting and removal of the tray module.

SUMMARY OF THE INVENTION

It is an objective of the present invention to provide a driving mechanism for driving a relative movement of two casings by utilizing an operating member.

According to an aspect of the present invention, the present invention discloses a driving mechanism. The driving mechanism includes a first casing, a second casing and at least one operating member. The second casing is arranged on the first casing. The at least one operating member is movably mounted on one of the first casing and the second casing. When the at least one operating member is moved from a first state to a second state, the at least one operating member drives another one of the first casing and the second casing to move from a first predetermined position to a second predetermined position along a first vertical direction. When the at least one operating member is moved from the second state to the first state, the another one of the first casing and the second casing moves from the second predetermined position to the first predetermined position along a second vertical direction opposite to the first vertical direction.

According to another aspect of the present invention, the present invention further discloses a driving mechanism. The driving mechanism includes a first casing, a second casing and a first operating member. The second casing is arranged on the first casing. The first operating member is movably mounted on the first casing. When the first operating member is moved from a first state to a second state, the first operating member drives the second casing to move linearly from a first predetermined position to a second predetermined position. When the first operating member is moved from the second state to the first state, the second casing moves from the second predetermined position to the first predetermined position.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the preferred embodiments, reference is made to the accompanying drawings which form a part hereof, and in which is shown by way of illustration specific embodiments in which the invention may be practiced. In this regard, directional terminology, such as "top", "bottom", "left", "right", "front", "back", etc., is used with reference to the orientation of the Figure(s) being described. The members of the present invention can be positioned in a number of different orientations. As such, the directional terminology is used for purposes of illustration and is in no way limiting. Accordingly, the drawings and descriptions will be regarded as illustrative in nature and not as restrictive. Also, if not specified, the term "connect" is intended to mean either an indirect or direct mechanical connection. Thus, if a first device is connected to a second device, that connection may be through a direct mechanical connection, or through an indirect mechanical connection via other devices and connections.

Figure 1:
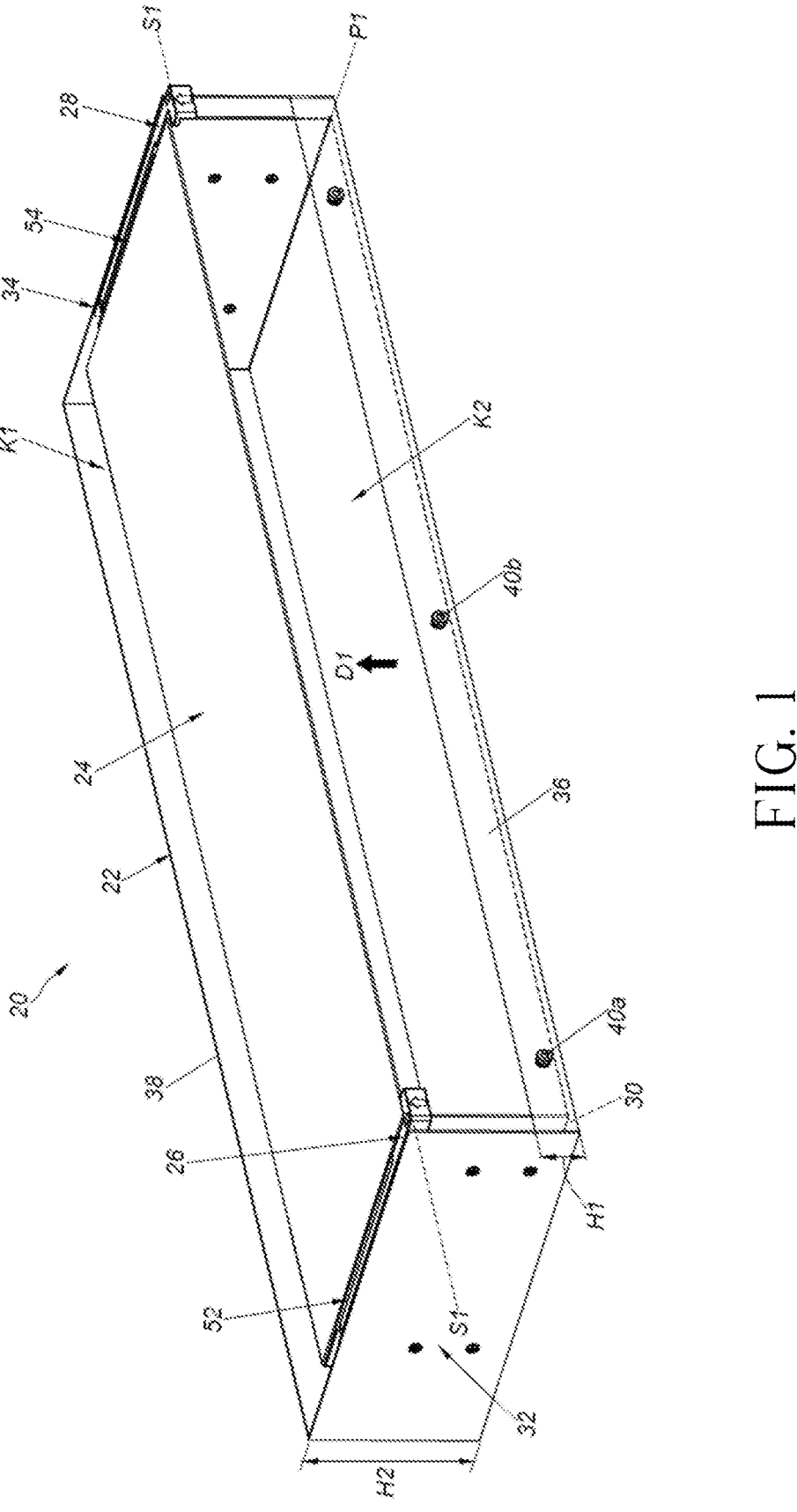
FIG. 1 and FIG. 2 are diagrams of a driving mechanism in different states according to an embodiment of the present invention.
Figure 2:
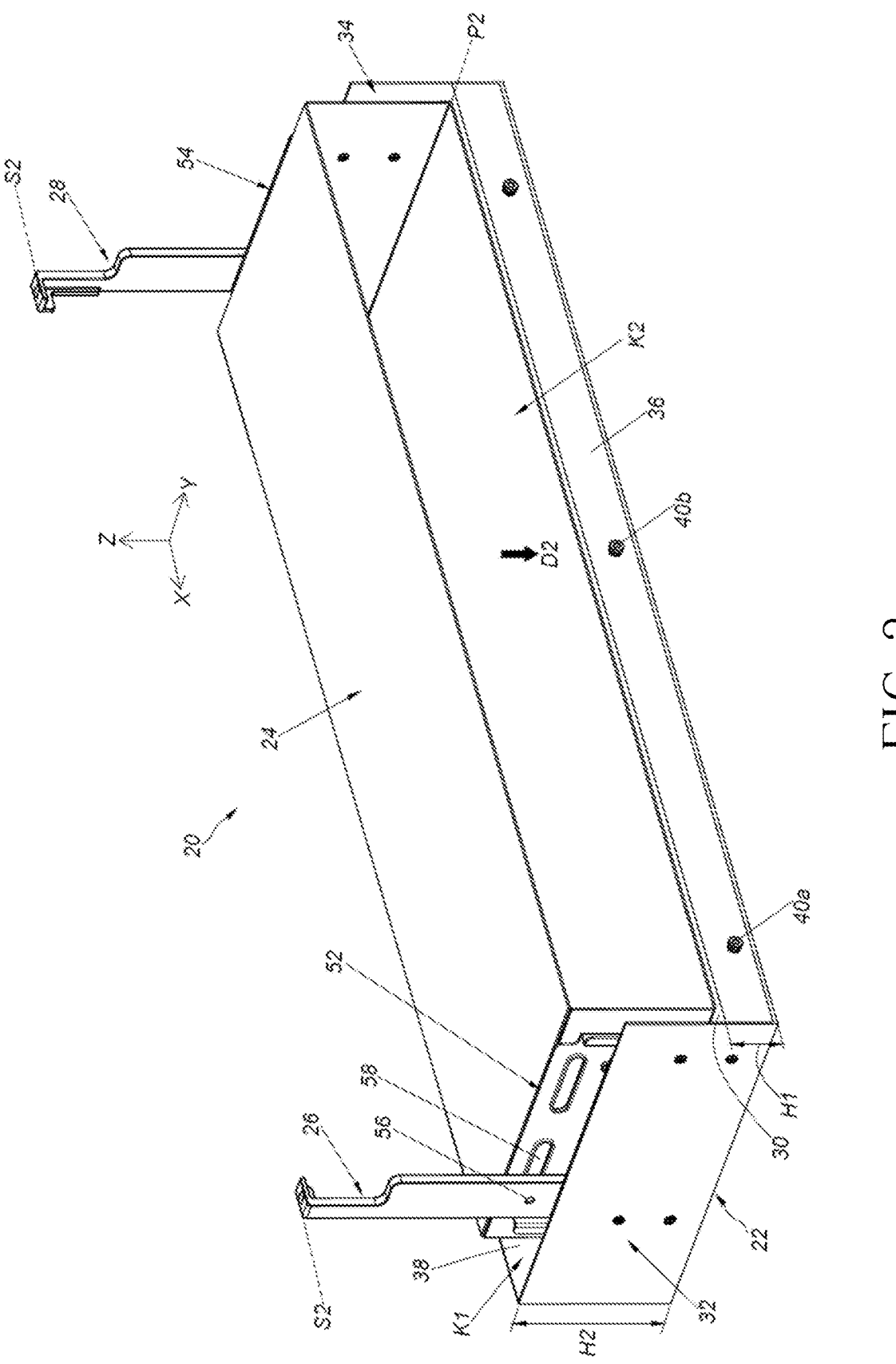

As shown in FIG. 1 and FIG. 2, a driving mechanism 20 includes a first casing 22, a second casing 24 and at least one operating member. Preferably, in this embodiment, by way of example, the at least one operating member includes a first operating member 26 and a second operating member 28, which are substantially symmetrical to each other. It should be noticed that, as shown in FIG. 2, in this embodiment, by way of example, a longitudinal direction can be defined by a length direction of the first casing 22 or the second casing 24, and parallel to an X axis. A transverse direction can be defined by a lateral direction or a width direction of the first casing 22 or the second casing 24, and parallel to a Y axis. A vertical direction can be defined by a height direction of the first casing 22 or the second casing 24, and parallel to a Z axis.

The second casing 24 is arranged on the first casing 22. As shown in FIG. 1, in this embodiment, by way of example, the second casing 24 is disposed above a supporting portion 30 of the first casing 22.

The first operating member 26 and the second operating member 28 are movably mounted on one of the first casing 22 and the second casing 24, and the other one of the first casing 22 and the second casing 24 moves in response to movements of the first operating member 26 and the second operating member 28. In this embodiment, by way of example, the first operating member 26 and the second operating member 28 are movably mounted on the first casing 22. The first operating member 26 and the second operating member 28 drive the second casing 24 to move relative to the first casing 22 from a first predetermined position P1 as shown in FIG. 1 to a second predetermined position P2 as shown in FIG. 2 along a first vertical direction D1, e.g., an upward direction, when the first operating member 26 and the second operating member 28 are moved from a first state S1 as shown in FIG. 1 to a second state S2 as shown in FIG. 2. The second casing 24 moves relative to the first casing 22 from the second predetermined position P2 as shown in FIG. 2 to the first predetermined position P1 as shown in FIG. 1 along a second vertical direction D2, e.g., a downward direction, which can be opposite to the first vertical direction D1, when the first operating member 26 and the second operating member 28 are moved from the second state S2 as shown in FIG. 2 to the first state S1 as shown in FIG. 1.

Preferably, the first casing 22 includes a first wall 32 and a second wall 34. A first space K1 of the first casing 22 is defined between the first wall 32 and the second wall 34 and configured to receive the second casing 24.

Preferably, the first operating member 26 and the second operating member 28 are rotatably mounted on the first wall 32 and the second wall 34 of the first casing 22, respectively.

Preferably, the first wall 32 and the second wall 34 of the first casing 22 are a front wall and a rear wall of the first casing 22, respectively.

Preferably, the first casing 22 further includes a first lateral wall 36 and a second lateral wall 38. As shown in FIG. 1, in this embodiment, by way of example, the first lateral wall 36 and the second lateral wall 38 are a left lateral wall and a right lateral wall of the first casing 22, respectively, and a first height H1 of the first lateral wall 36 is less than a second height H2 of the second lateral wall 38. However, the present invention is not limited to this embodiment. The aforementioned configuration of the first casing 22 can expose the second casing 24 so as to provide lateral access to the second casing 24 received in the first casing 22, such that a user can detach or unload at least one carried object from a second space K2 of the second casing 24 or place the at least one carried object into the second space K2 of the second casing 24 easily.

Preferably, the supporting portion 30 of the first casing 22 can be a bottom portion of the first casing 22, e.g., a bottom surface of the first casing 22.

Preferably, a plurality of mounting features are arranged on each of the first lateral wall 36 and the second lateral wall 38 of the first casing 22 for easy mounting of the driving mechanism 20. In this embodiment, by way of example, the plurality of mounting features can at least include a first mounting feature 40a and a second mounting feature 40b.

Preferably, the structural configuration of the first operating member 26, the first casing 22 and the second casing 24 can be substantially symmetrical to the structural configuration of the second operating member 28, the first casing 22 and the second casing 24. The operational principle of the first operating member 26 is substantially identical to the operational principle of the second operating member 28. Detailed description for the structural configuration of the first operating member 26 and the first wall 32 of the first casing 22 and the operational principle of the first operating member 26 is provided as follows, and detailed description for the structural configuration of the second operating member 28 and the second wall 34 of the first casing 22 and the operational principle of the second operating member 28 is omitted herein for simplicity.

Figure 3:
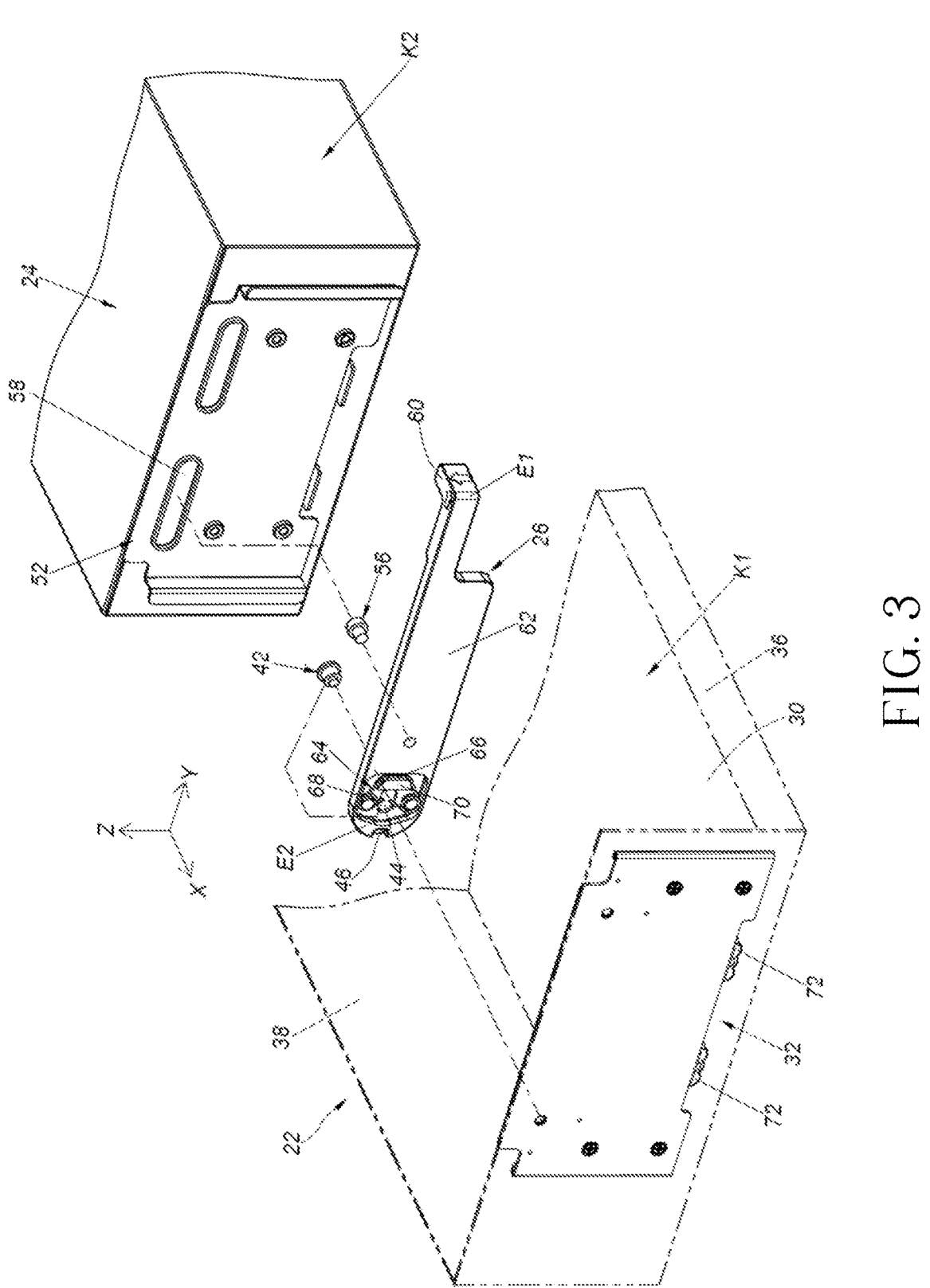
FIG. 3 and FIG. 4 are partial exploded diagrams of the driving mechanism at different views according to the embodiment of the present invention.
Figure 4:
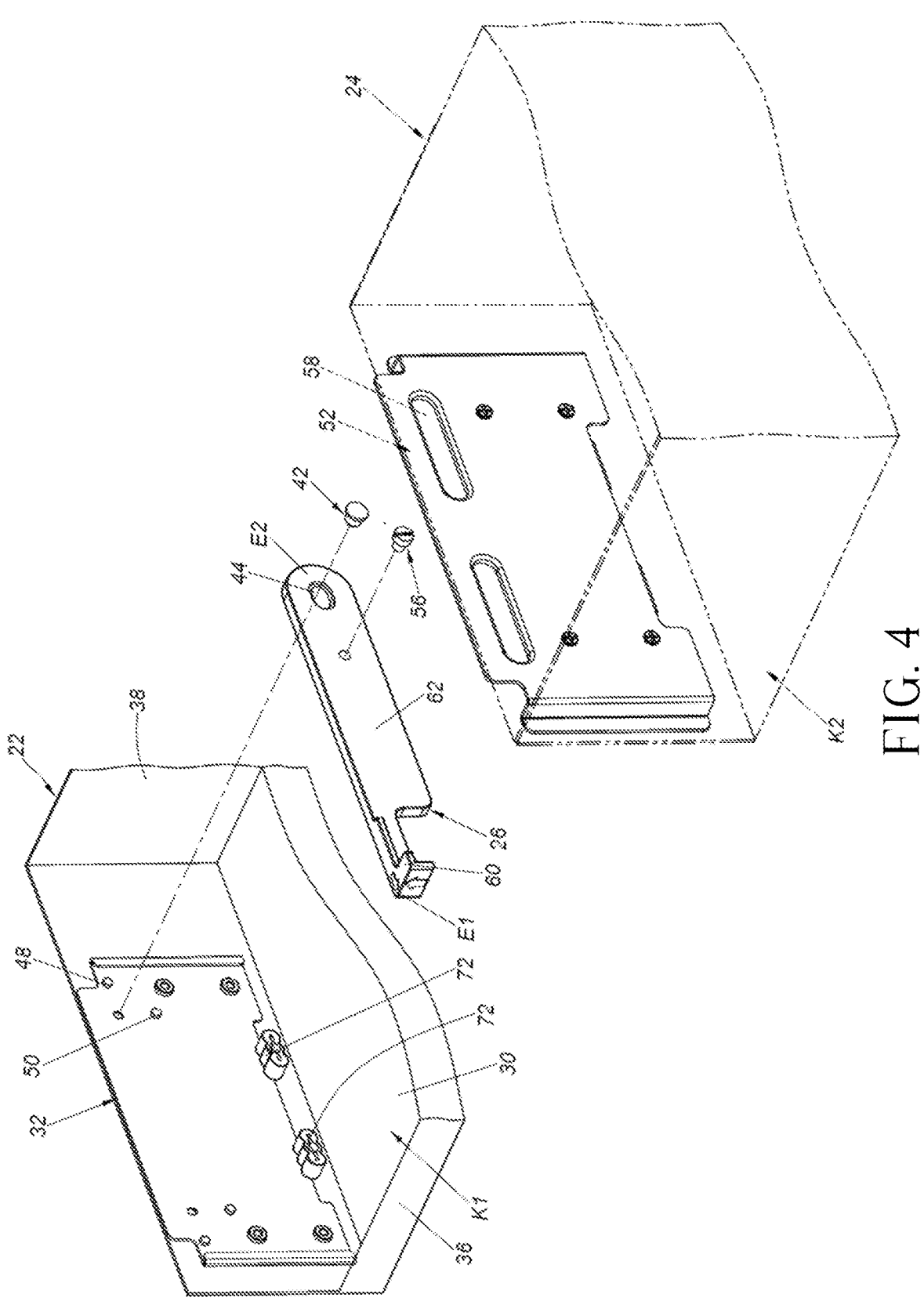
Figure 5:
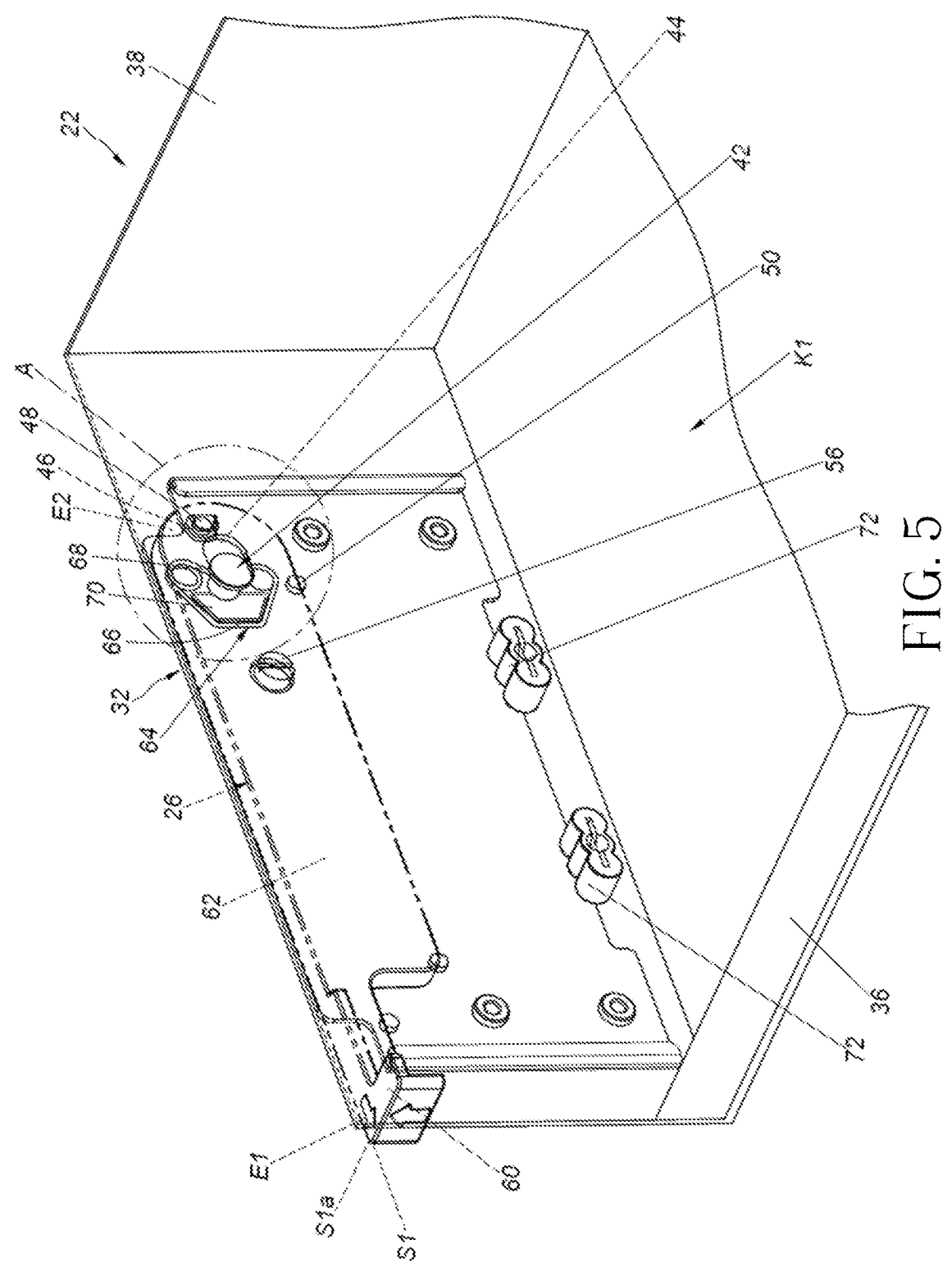
FIG. 5 is a partial diagram of the driving mechanism according to the embodiment of the present invention.

As shown in FIG. 3 to FIG. 5, a shaft member 42 is arranged on one of the first wall 32 of the first casing 22 and the first operating member 26, and an elongated hole 44 is arranged on the other one of the first wall 32 of the first casing 22 and the first operating member 26 for allowing the shaft member 42 to pass therethrough. As shown in FIG. 5, in this embodiment, by way of example, the elongated hole 44 is arranged on the first operating member 26, and the shaft member 42 is connected to, e.g., fixedly connected to, the first wall 32 of the first casing 22, and passes through a portion of the elongated hole 44 arranged on the first operating member 26.

Preferably, as shown in FIG. 3 and FIG. 5, the first operating member 26 includes an engaging feature 46, and a first corresponding feature 48 and a second corresponding feature 50 are arranged on the first wall 32 of the first casing 22. The engaging feature 46 is configured to engage with the first corresponding feature 48 or the second corresponding feature 50 selectively. As shown in FIG. 4 and FIG. 5, in this embodiment, by way of example, the engaging feature 46 can be a notch or a C-shaped slot formed on a wall of the first operating member 26, and the first corresponding feature 48 and the second corresponding feature 50 can be two protrusions. However, the present invention is not limited to this embodiment.

Preferably, the second casing 24 includes a first predetermined wall 52 and a second predetermined wall 54. As shown in FIG. 1 and FIG. 2, in this embodiment, by way of example, the first predetermined wall 52 and the second predetermined wall 54 of the second casing 24 can be a front wall and a rear wall of the second casing 24, respectively. Furthermore, a driving member 56 is arranged on one of the first operating member 26 and the second casing 24, e.g., the first predetermined wall 52 of the second casing 24, and a predetermined hole 58 is arranged on the other one of the first operating member 26 and the second casing 24, e.g., the first predetermined wall 52 of the second casing 24, for allowing the driving member 56 to pass therethrough. The predetermined hole 58 has a predetermined length. When the first operating member 26 is in the first state S1, a length direction of the predetermined hole 58 is substantially parallel to a length direction of the elongated hole 44. Specifically, the driving member 56 can be a protrusion or a pin passing through a portion of the predetermined hole 58. In this embodiment, by way of example, the predetermined hole 58 is arranged on the second casing 24, e.g., the first predetermined wall 52 of the second casing 24, and the driving member 56 is arranged on the first operating member 26 and passes through a portion of the predetermined hole 58. However, the present invention is not limited to this embodiment.

Preferably, the first operating member 26 further includes an operating portion 60. The operating portion 60 and the engaging feature 46 are located adjacent to two opposite ends of the first operating member 26, respectively. In this embodiment, by way of example, the operating portion 60 and the engaging feature 46 are located adjacent to a first end E1 and a second end E2 of the first operating member 26, respectively. Besides, the first operating member 26 further includes an extending portion 62 connected between the first end E1 and the second end E2 of the first operating member 26, and the elongated hole 44 and the driving member 56 are arranged on the extending portion 62.

Figure 6:
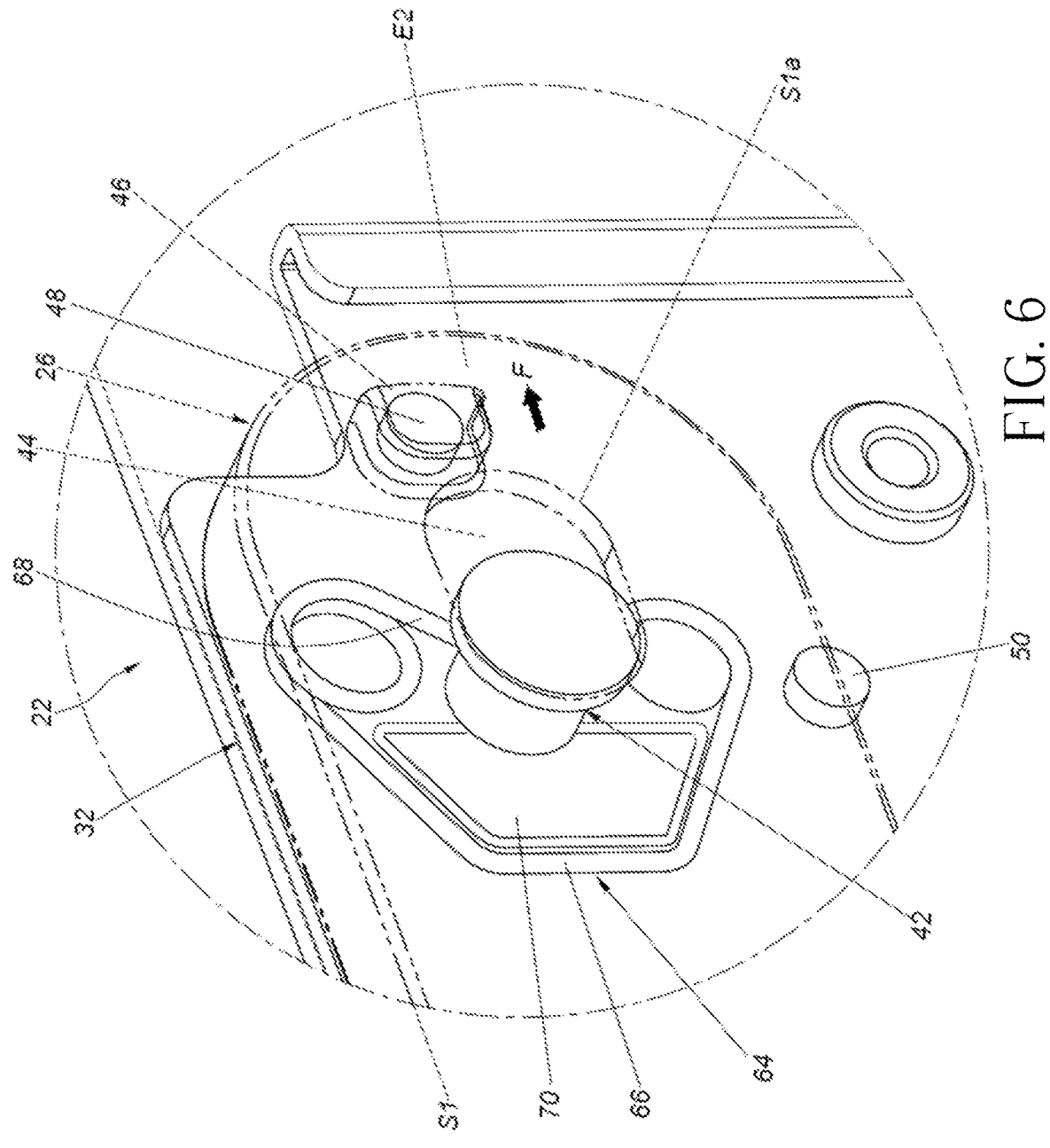
FIG. 6 is an enlarged diagram of an A portion of the driving mechanism as shown in FIG. 5 according to the embodiment of the present invention.

Preferably, as shown in FIG. 5 and FIG. 6, the driving mechanism 20 further includes a resilient member 64 configured to provide a resilient force F to the first operating member 26.

Preferably, as shown in FIG. 3, FIG. 5 and FIG. 6, the resilient member 64 includes a first resilient portion 66 and at least one second resilient portion 68. As shown in FIG. 3 and FIG. 6, the first resilient portion 66 is hooked on a predetermined feature 70 of the first operating member 26. As shown in FIG. 5, the second resilient portion 68 is connected to the first casing 22. As shown in FIG. 5, in this embodiment, by way of example, the second resilient portion 68 is connected to the shaft member 42 on the first wall 32 of the first casing 22. However, the present invention is not limited to this embodiment.

Preferably, at least one buffering device 72 is arranged on one of the first casing 22 and the second casing 24. In this embodiment, by way of example, the at least one buffering device 72 is arranged on the first wall 32 of the first casing 22 and can be a resilient object or a flexible object. However, the present invention is not limited to this embodiment. For example, in another embodiment, the buffering device 72 can be a hydraulic support rod assembly or a recoil spring support rod assembly.

As shown in FIG. 3 to FIG. 6, the driving member 56 on the first operating member 26 is configured to pass through a portion of the predetermined hole 58 on the second casing 24. As shown in FIG. 5 and FIG. 6, when the first operating member 26 is in the first state S1 and located at a first position Sla, the engaging feature 46 and the first corresponding feature 48 engage with each other for preventing the first operating ember 26 from moving away from the first state S1.

Preferably, as shown in FIG. 5 and FIG. 6, the first operating member 26 in the first state S1 is retained at the first position Sla in response to the resilient force F provided by the resilient member 64 and acting on the second end E2 of the first operating member 26 for keeping engaging the engaging feature 46 with the first corresponding feature 48, such that the second casing 24 is locked at the first predetermined position P1 relative to the first casing 22.

Figure 7:
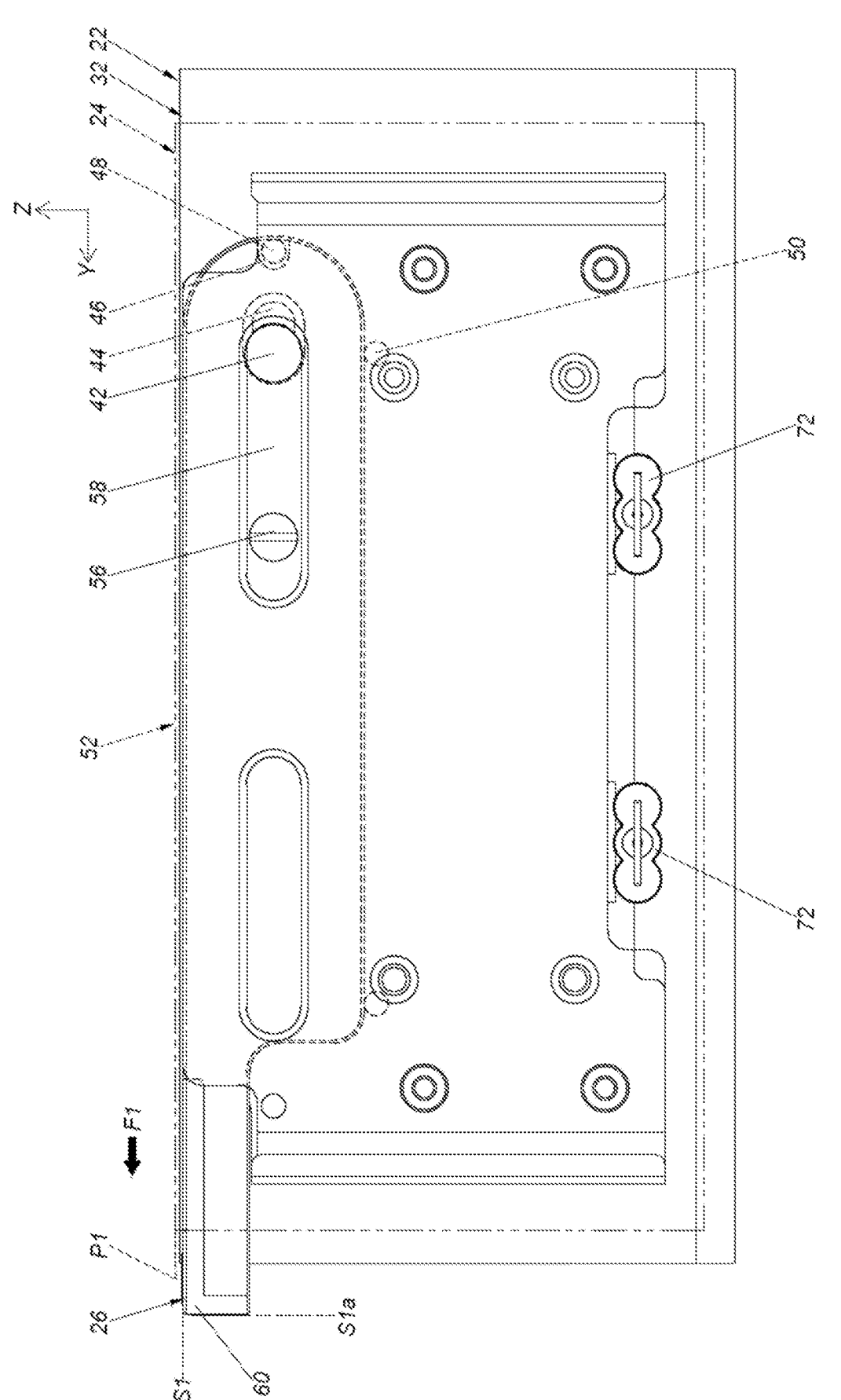
FIG. 7 is a diagram of the driving mechanism as a first operating member is in a first state and located at a first position according to the embodiment of the present invention.

As shown in FIG. 7, when the second casing 24 is locked at the first predetermined position P1 relative to the first casing 22 by the first operating member 26 in the first state S1 and at the first position Sla, the first operating member 26 and the first wall 32 of the first casing 22 are substantially parallel to each other in the transverse direction, i.e., the lateral direction, or extend along the Y axis in parallel. When the first operating member 26 in the first state S1 is moved from the first position Sla as shown in FIG. 7 to a second position S1b as shown in FIG. 8, the engaging feature 46 and the first corresponding feature 48 disengage from each other for allowing the first operating member 26 to move from the first state S1 to the second state S2 along a first predetermined direction R1.

Figure 8:
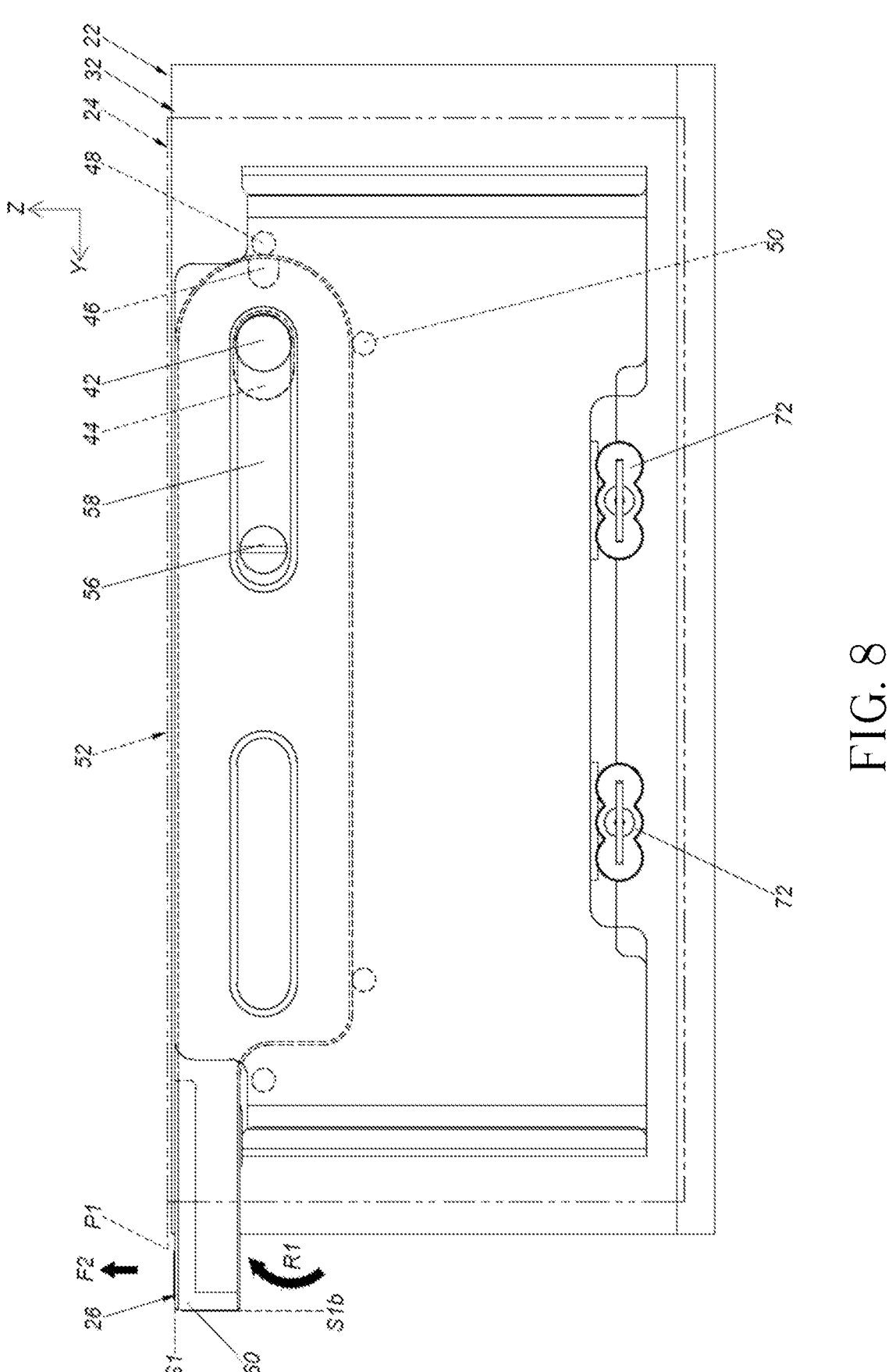
FIG. 8 is a diagram of the driving mechanism as the first operating member is in the first state and located at a second position according to the embodiment of the present invention.
Figure 9:
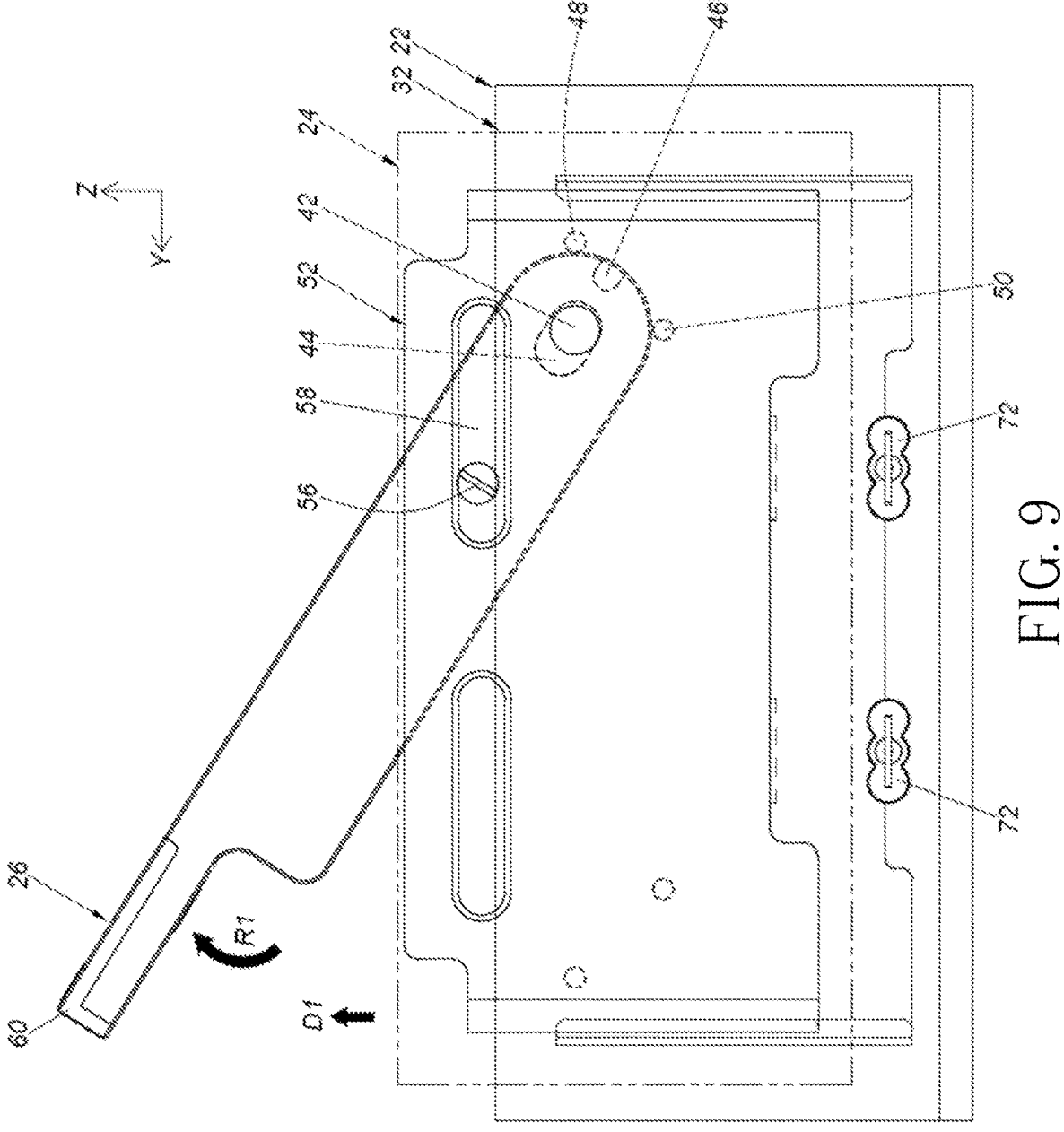
FIG. 9 is a diagram of the driving mechanism as the first operating member is moved from the first state toward a second state for driving the second casing to move away from a first predetermined position according to the embodiment of the present invention.

As shown in FIG. 7 to FIG. 9, the first operating member 26 in the first state S1 can be moved from the first position Sla to the second position S1b by operating the operating portion 60 of the operating member 26 with a first force F1, so as to disengage the engaging feature 46 from the first corresponding feature 48. Afterwards, the first operating member 26 can be moved from the first state S1 to the second state S2 along the first predetermined direction R1 by operating the operating portion 60 of the operating member 26 with a second force F2. In this embodiment, the first operating member 26 is configured to rotate by 90 degrees to move from the first state S1 to the second state S2. However, the present invention is not limited to this embodiment.

Figure 10:
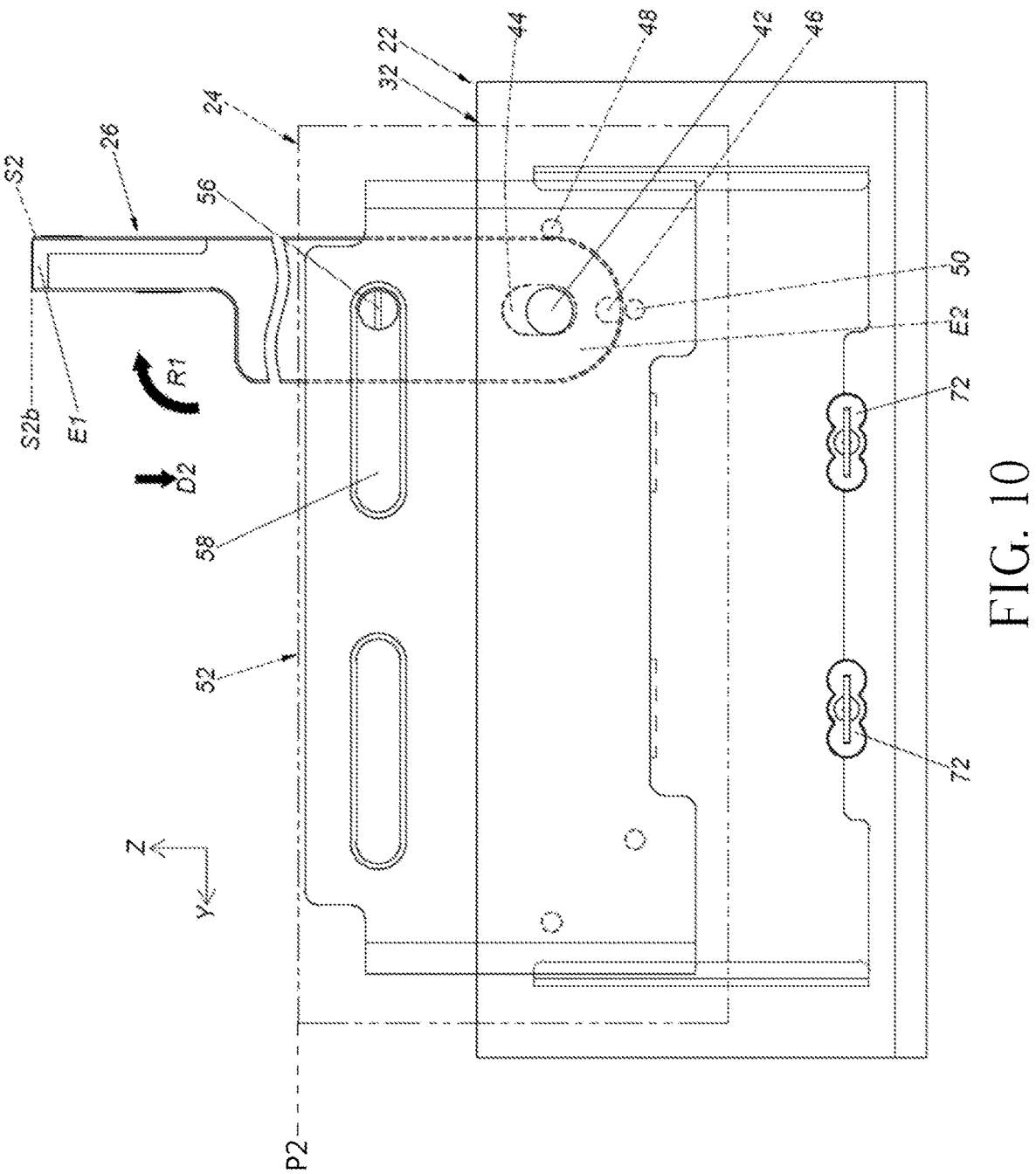
FIG. 10 is a diagram of the driving mechanism as the first operating member is in the second state and located at a fourth position according to the embodiment of the present invention.

When the first operating member 26 is moved from the first state S1 to the second state S2, the first operating member 26 drives the second casing 24 to linearly move relative to the first casing 22 from the first predetermined position P1 as shown in FIG. 8 to the second predetermined position P2 as shown in FIG. 10 through an intermediate position as shown in FIG. 9 along the first vertical direction D1.

Figure 11:
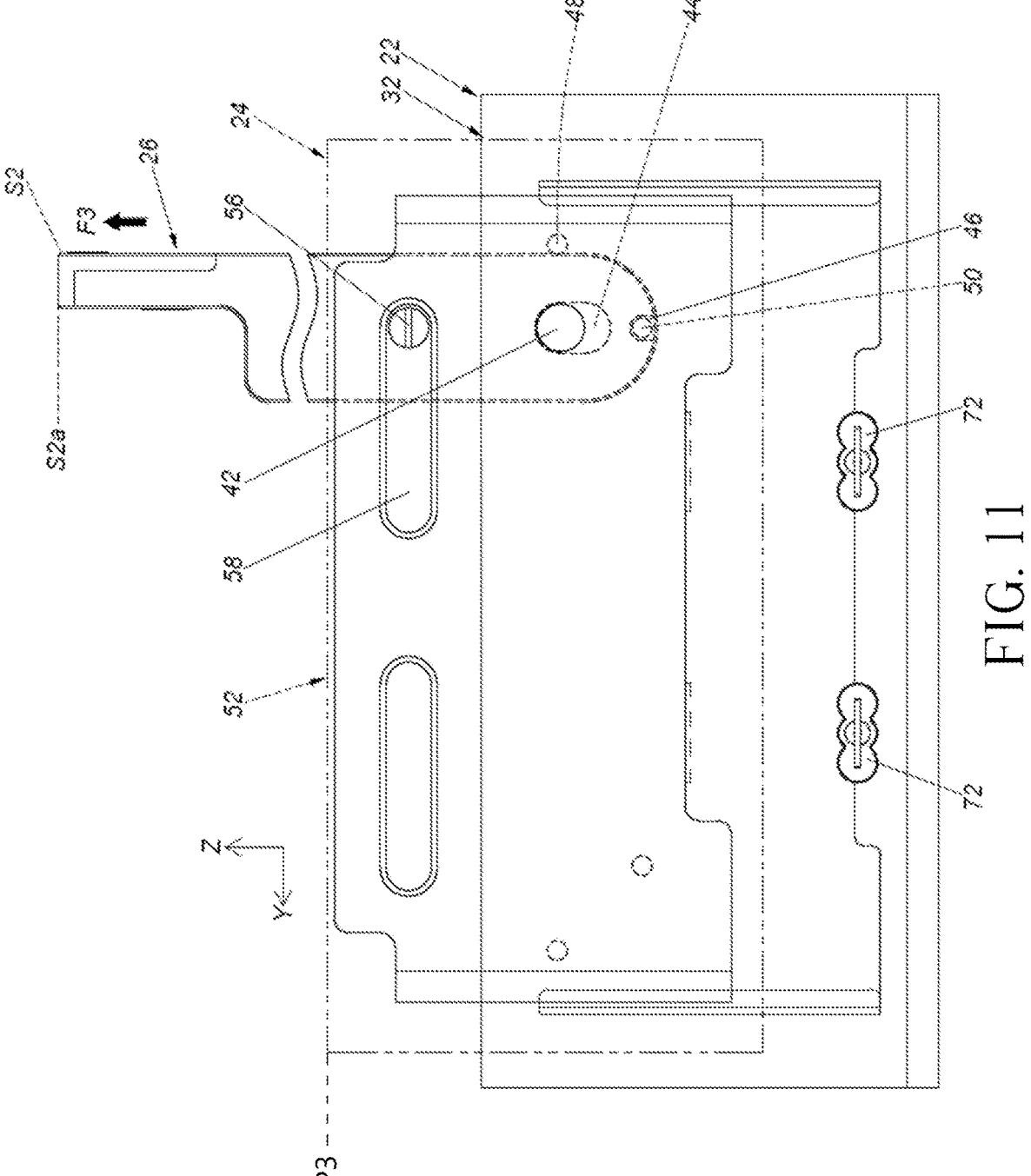
FIG. 11 is a diagram of the driving mechanism as the first operating member is in the second state and located at a third position according to the embodiment of the present invention.

As shown in FIG. 10 and FIG. 11, after the first operating member 26 is moved from the first state S1 to the second state S2, the first operating member 26 in the second state S2 can be moved from a fourth position S2b to a third position S2a along the second vertical direction D2, in response to the resilient force F provided by the resilient member 64 and/or a gravity force, so as to engage the engaging feature 46 with the second corresponding feature 50 for preventing the first operating member 26 from moving away from the second state S2. Accordingly, the second casing 24 moves from the second predetermined position P2 to a third predetermined position P3, which is slightly lower than the second predetermined position P2, to be locked at the third predetermined position P3 relative to the first casing 22 to allow the user to detach or unload the at least one carried object from the second space K2 of the second casing 24 or place the at least one carried object into the second space K2 of the second casing 24 easily.

Figure 12:
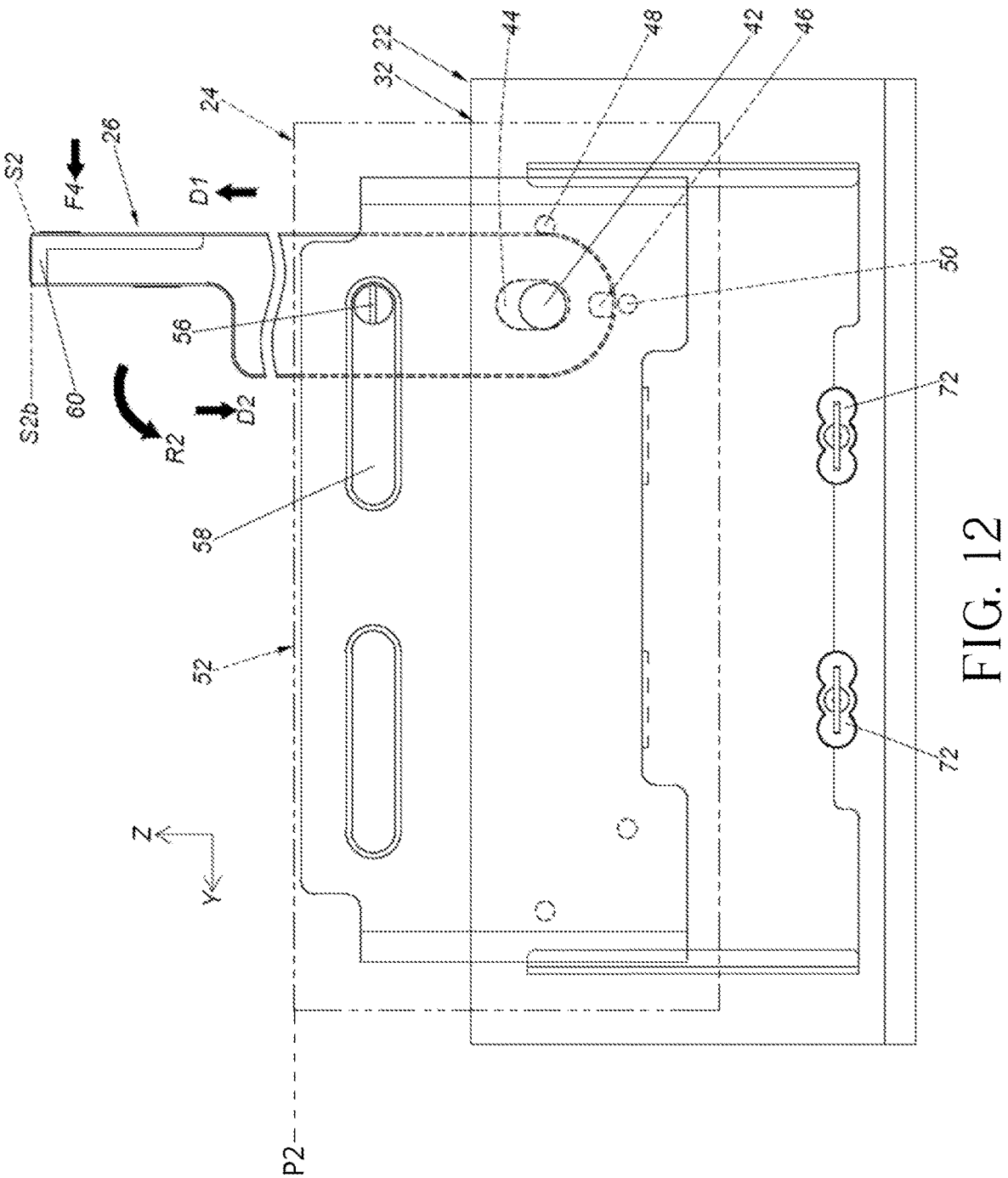
FIG. 12 is a diagram of the driving mechanism as the first operating member in the second state is moved from the third position to the fourth position for driving the second casing to move from a third predetermined position to a second predetermined position according to the embodiment of the present invention.

As shown in FIG. 11 and FIG. 12, the first operating member 26 in the second state S2 can be moved from the third position S2a to the fourth position S2b along the first vertical direction D1 by operating the operating portion 60 of the operating member 26 with a third force F3, so as to disengage the engaging feature 46 from the second corresponding feature 50. When the first operating member 26 in the second state S2 is moved from the third position S2a to the fourth position S2b along the first vertical direction D1, the first operating member 26 drives the second casing 24 to linearly move relative to the first casing 22 from the third predetermined position P3 to the second predetermined position P2 along the first vertical direction D1. Afterwards, the first operating member 26 can be moved from the second state S2 to the first state S1 along a second predetermined direction R2 opposite to the first predetermined direction R1 by operating the operating portion 60 of the operating member 26 with a fourth force F4. When the first operating member 26 is moved from the second state S2 to the first state S1, the first operating member 26 drives the second casing 24 to linearly move relative to the first casing 22 from the second predetermined position P2 to the first predetermined position P1 along the second vertical direction D2. After the first operating member 26 is moved from the second state S2 to the first state S1, the first operating member 26 in the first state S1 can be moved from the second position S1b to the first position S1a in response to the resilient force F provided by the resilient member 64, so as to engage the engaging feature 46 with the first corresponding feature 48 for preventing the first operating member 26 from moving away from the first state S1 to lock the second casing 24 at the first predetermined position P1 relative to the first casing 22.

Preferably, as shown in FIG. 7, when the second casing 24 moves from the second predetermined position P2 to the first predetermined position P1 along the second vertical direction D2, the at least one buffering device 72 on the first casing 22 is configured to be in contact with the second casing 24, so as to provide a shock absorbing effect or a noise reducing effect.

Figure 13:
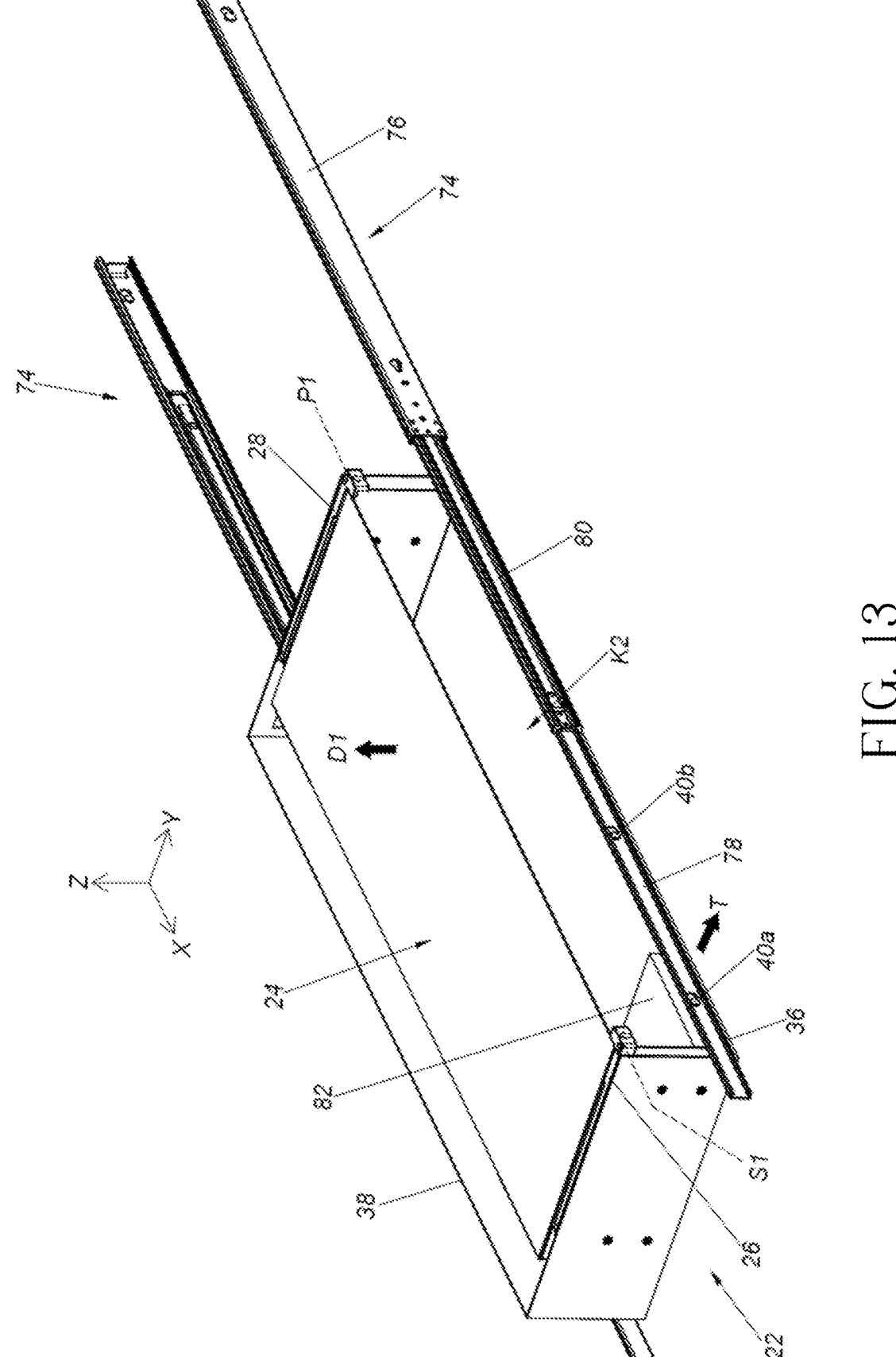
FIG. 13 is a diagram of the driving mechanism adapted for a slide rail assembly as a carried object mounted on the second casing is blocked by the slide rail assembly according to the embodiment of the present invention.
Figure 14:
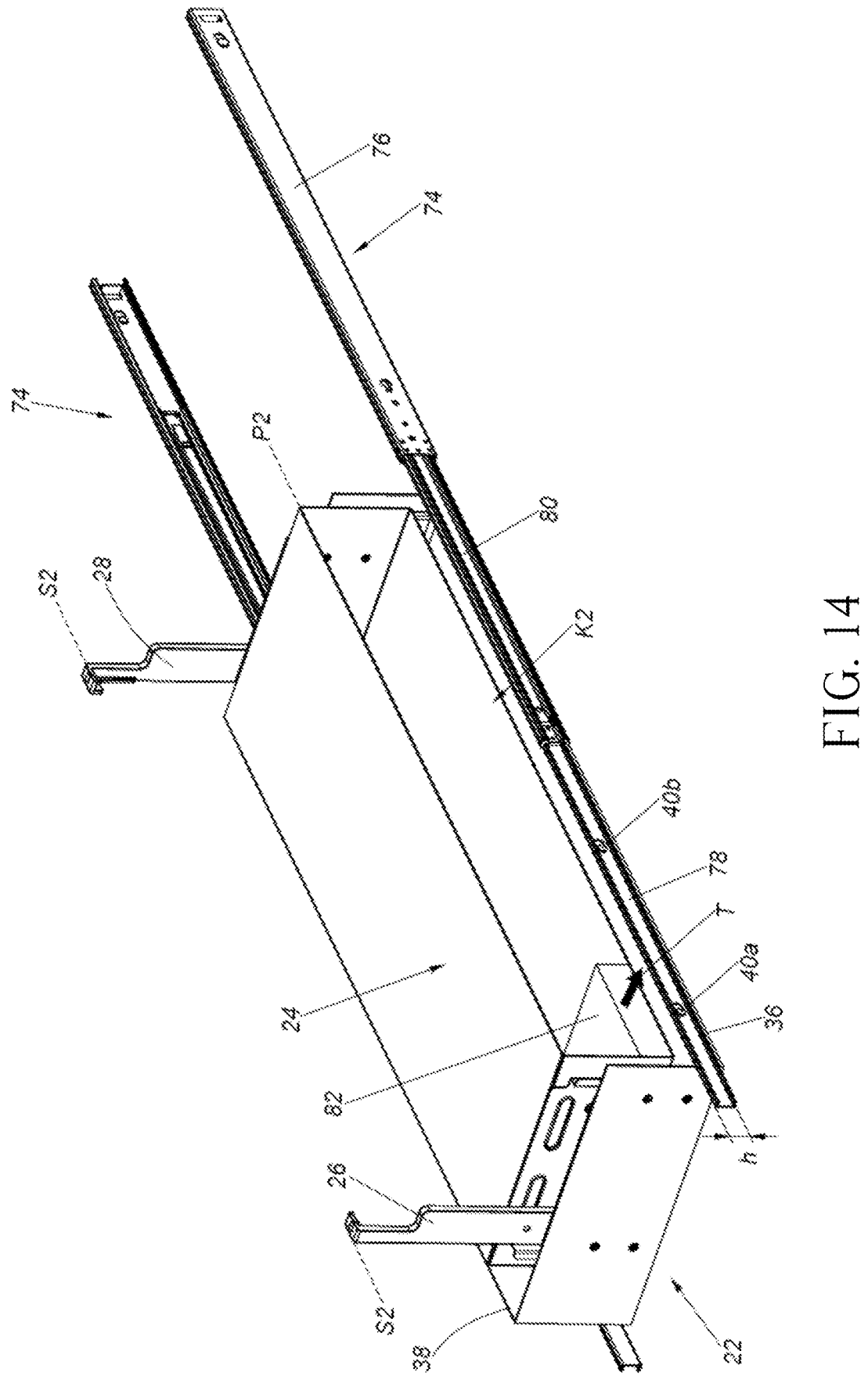
FIG. 14 is a diagram of the driving mechanism adapted for the slide rail assembly as the carried object mounted on the second casing is not blocked by the slide rail assembly according to the embodiment of the present invention.

As shown in FIG. 13 and FIG. 14, the driving mechanism 20 is adapted for at least one slide rail assembly 74. In this embodiment, the at least one slide rail assembly 74 includes two slide rail assemblies 74 substantially symmetrical to each other. Specifically, each of the two slide rail assemblies 74 includes a first rail 76 and a second rail 78 displaceable relative to the first rail 76. Preferably, each of the two slide rail assemblies 74 further includes a third rail 80 movably mounted between the first rail 76 and the second rail 78. The first rail 76 is fixedly mounted on a targeted object, e.g., a cabinet or a rack. Each of the first lateral wall 36 and the second lateral wall 38 of the first casing 22 is mounted on the corresponding second rail 78 by the corresponding first mounting feature 40a and the corresponding second mounting feature 40b.

As shown in FIG. 13, when the second casing 24 is located at the first predetermined position P1 relative to the first casing 22, at least one carried object 82, e.g., an electronic device or a hard disk drive, on the second casing 24 is blocked by the corresponding second rail 78 along the transverse direction, e.g., a lateral direction T, such that the at least one carried object 82 cannot be detached or unloaded from the second space K2 of the second casing 24 along the lateral direction T. As shown in FIG. 14, when the second casing 24 moves from the first predetermined position P1 to the second predetermined position P2 relative to the first casing 22 by operating the first operating member 26 and/or the second operating member 28, the second casing 24 is configured to move the at least one carried object 82 above the corresponding second rail 78 having a predetermined height h, such that the at least one carried object 82 on the second casing 24 is not blocked by the corresponding second rail 78 along the lateral direction T for allowing the user to detach or unload the at least one carried object 82 from the second space K2 of the second casing 24 along the lateral direction T. It should be noticed that, when the second casing 24 moves from the second predetermined position P2 to the third predetermined position P3 relative to the first casing 22, the at least one carried object 82 is still above the corresponding second rail 78 having the predetermined height h for allowing the user to detach or unload the at least one carried object 82 from the second space K2 of the second casing 24 along the lateral direction T.

Understandably, in another embodiment, the driving mechanism can include the first operating member only, and the second operating member can be omitted.

From the above, the present invention has following characteristics:

1. Contrary to a conventional tray module, which is configured to nonlinearly move along a non-straight path or a non-vertical path, in the present invention, when the at least one operating member, e.g., the first operating member 26 and/or the second operating member 28, is moved from the first state S1 to the second state S2, the at least one operating member is configured to drive the second casing 24 to linearly move relative to the first casing 22 from the first predetermined position P1 to the second predetermined position P2 to meet specific requirements.

2. When the at least one operating member, e.g., the first operating member 26 and/or the second operating member 28, is in the first state S1, in response to the resilient force F provided by the resilient member 64, the engaging feature 46 and the first corresponding feature 48 are engaged with each other for preventing the at least one operating member from moving away from the first state S1 to lock the second casing 24 at the first predetermined position P1. When the at least one operating member, e.g., the first operating member 26 and/or the second operating member 28, is in the second state S2, in response to the resilient force F provided by the resilient member 64, the engaging feature 46 and the second corresponding feature 50 are engaged with each other for preventing the at least one operating member from moving away from the second state S2 to lock the second casing 24 at the third predetermined position P3. The prevent invention can prevent an unintentional movement of the second casing 24, and therefore, the present invention is safe and reliable.

3. When the second casing 24 is linearly moved from the first predetermined position P1 to the second predetermined position P2 or the third predetermined position P3 relative to the first casing 22, the second casing 24 is configured to move the at least one carried object 82 above the corresponding second rail 78 having the predetermined height h, such that it is easy for the user to detach or unload the at least one carried object 82 from the second space K2 of the second casing 24 along the lateral direction T.

4. When the second casing 24 moves from the second predetermined position P2 to the first predetermined position P1, the at least one buffering device 72 on the first casing 22 is configured to be in contact with the second casing 24, so as to provide the shock absorbing effect or the noise reducing effect.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A driving mechanism comprising:
a first casing;
a second casing arranged on the first casing; and
at least one operating member movably mounted on one of the first casing and the second casing;
wherein when the at least one operating member is moved from a first state to a second state, the at least one operating member drives another one of the first casing and the second casing to move from a first predetermined position to a second predetermined position along a first vertical direction;
wherein when the at least one operating member is moved from the second state to the first state, the another one of the first casing and the second casing moves from the second predetermined position to the first predetermined position along a second vertical direction opposite to the first vertical direction;
wherein the at least one operating member is rotatable between the first state and the second state, when the at least one operating member is in the first state, the at least one operating member is translatable between a first position and a second position, when the at least one operating member is in the first state and at the first position, the at least one operating member is prevented from rotating away from the first state, and when the at least one operating member is in the first state and at the second position, the at least one operating member is allowed to rotate away from the first state.

2. The driving mechanism of claim 1, wherein the first casing comprises a first wall and a second wall, and a space of the first casing is defined between the first wall and the second wall of the first casing and configured to accommodate the second casing.

3. The driving mechanism of claim 2, wherein the at least one operating member comprises a first operating member and a second operating member, and the first operating member and the second operating member are rotatably mounted on the first wall and the second wall of the first casing respectively.

4. The driving mechanism of claim 3, wherein the first operating member is rotatably mounted on the first wall of the first casing in a same way as that the second operating member is rotatably mounted on the second wall of the first casing.

5. The driving mechanism of claim 4, wherein a shaft member is arranged on one of the first wall of the first casing and the first operating member, an elongated hole is arranged on another one of the first wall of the first casing and the first operating member, and the shaft member passes through a portion of the elongated hole.

6. The driving mechanism of claim 5, wherein the first operating member comprises an engaging feature, a first corresponding feature is arranged on the first wall of the first casing, and when the first operating member in the first state is located at the first position, the engaging feature and the first corresponding feature engage with each other for preventing the first operating member from moving away from the first state.

7. The driving mechanism of claim 6, further comprising a resilient member, and the first operating member in the first state being moved to the first position in response to a resilient force provided by the resilient member.

8. The driving mechanism of claim 7, wherein when the first operating member in the first state is moved from the first position to the second position, the engaging feature and the first corresponding feature disengage from each other for allowing the first operating member to move from the first state to the second state.

9. The driving mechanism of claim 8, wherein a second corresponding feature is further arranged on the first wall of the first casing, and when the first operating member in the second state is located at a third position, the engaging feature and the second corresponding feature engage with each other for preventing the first operating member from moving from the second state to the first state.

10. The driving mechanism of claim 9, wherein the first operating member in the second state is moved to the third position in response to the resilient force provided by the resilient member.

11. The driving mechanism of claim 10, wherein when the first operating member in the second state is moved from the third position to a fourth position, the engaging feature and the second corresponding feature disengage from each other for allowing the first operating member to move from the second state to the first state.

12. The driving mechanism of claim 2, wherein the first wall and the second wall of the first casing are a front wall and a rear wall of the first casing respectively.

13. The driving mechanism of claim 12, wherein the first casing further comprises a first lateral wall and a second lateral wall, and one of the first lateral wall and the second lateral wall of the first casing is configured to be mounted on a slide rail.

14. The driving mechanism of claim 13, wherein the second casing is configured to support at least one carried object, and when the second casing moves from the first predetermined position to the second predetermined position, the second casing is configured to move the at least one carried object above the slide rail for allowing detachment or unloading of the at least one carried object from the second casing.

15. The driving mechanism of claim 1, wherein at least one buffering device is arranged on the one of the first casing and the second casing, and when the another one of the first casing and the second casing moves from the second predetermined position to the first predetermined position along the second vertical direction, the at least one buffering device is configured to abut against the another one of the first casing and the second casing.

16. A driving mechanism comprising:
a first casing;
a second casing arranged on the first casing; and
a first operating member movably mounted on the first casing;

wherein when the first operating member is moved from a first state to a second state, the first operating member drives the second casing to move linearly from a first predetermined position to a second predetermined position;

wherein when the first operating member is moved from the second state to the first state, the second casing moves from the second predetermined position to the first predetermined position:

wherein a driving member is arranged on the first operating member, a predetermined hole is arranged on the second casing, and the driving member passes through a portion of the predetermined hole.

17. The driving mechanism of claim 16, wherein the first casing comprises a first wall and a second wall, a space of the first casing is defined between the first wall and the second wall of the first casing and configured to accommodate the second casing, the driving mechanism further comprises a second operating member, the first operating member and the second operating member are rotatably mounted on the first wall and the second wall of the first casing respectively, and the first operating member is rotatably mounted on the first wall of the first casing in a same way as that the second operating member is rotatably mounted on the second wall of the first casing.

18. The driving mechanism of claim 17, wherein the first wall and the second wall of the first casing are a front wall and a rear wall of the first casing respectively, the first casing further comprises a first lateral wall and a second lateral wall, one of the first lateral wall and the second lateral wall of the first casing is configured to be mounted on a slide rail, the second casing is configured to support at least one carried object, and when the second casing moves from the first predetermined position to the second predetermined position, the second casing is configured to move the carried object above the slide rail for allowing detachment or unloading of the at least one carried object from the second casing.

19. The driving mechanism of claim 17, wherein a shaft member is arranged on one of the first wall of the first casing and the first operating member, an elongated hole is arranged on another one of the first wall of the first casing and the first operating member, the shaft member passes through a portion of the elongated hole, the first operating member comprises an engaging feature, a first corresponding feature is arranged on the first wall of the first casing, when the first operating member in the first state is located at a first position, the engaging feature and the first corresponding feature engage with each other for preventing the first operating member from moving away from the first state, the driving mechanism further comprises a resilient member, and the first operating member in the first state is moved to the first position in response to a resilient force provided by the resilient member.

20. The driving mechanism of claim 19, wherein when the first operating member in the first state is moved from the first position to a second position, the engaging feature and the first corresponding feature disengage from each other for allowing the first operating member to move from the first state to the second state, a second corresponding feature is further arranged on the first wall of the first casing, when the first operating member in the second state is in a third position, the engaging feature and the second corresponding feature engage with each other for preventing the first operating member from moving from the second state to the first state, and the first operating member in the second state is moved to the third position in response to the resilient force provided by the resilient member.

* * * * *